(12) United States Patent
Yonamoto

(10) Patent No.: US 12,392,741 B2
(45) Date of Patent: Aug. 19, 2025

(54) COMPONENT ANALYSIS APPARATUS AND COMPONENT ANALYSIS METHOD

(71) Applicant: Hitachi High-Tech Corporation, Tokyo (JP)

(72) Inventor: Yoshiki Yonamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 253 days.

(21) Appl. No.: 18/141,773

(22) Filed: May 1, 2023

(65) Prior Publication Data

US 2023/0400424 A1    Dec. 14, 2023

(30) Foreign Application Priority Data

Jun. 9, 2022   (JP) .................................. 2022-093615

(51) Int. Cl.
  *G01V 3/00*    (2006.01)
  *G01N 24/00*   (2006.01)
  *G01N 24/08*   (2006.01)

(52) U.S. Cl.
  CPC ........... *G01N 24/006* (2013.01); *G01N 24/08* (2013.01)

(58) Field of Classification Search
  CPC .............................. G01N 24/006; G01N 24/08
  USPC .......................................................... 324/307
  See application file for complete search history.

(56) References Cited

U.S. PATENT DOCUMENTS

| | | | |
|---|---|---|---|
| 2002/0122743 A1* | 9/2002 | Huang | ...................... A61L 2/10 |
| 2015/0253355 A1 | 9/2015 | Grinolds et al. | |
| 2015/0374250 A1* | 12/2015 | Hatano | ................ A61B 5/0071 |

FOREIGN PATENT DOCUMENTS

| | | | |
|---|---|---|---|
| CN | 106687035 A | * | 5/2017 |
| CN | 106872560 A | * | 6/2017 |
| DE | 102011016342 A1 | * | 10/2012 |
| JP | 3970811 B2 | * | 12/2015 |

* cited by examiner

*Primary Examiner* — Walter L Lindsay, Jr.
*Assistant Examiner* — Frederick Wenderoth
(74) *Attorney, Agent, or Firm* — Crowell & Moring LLP

(57) ABSTRACT

To provide an optical nuclear magnetic resonance apparatus in which a cleaning mechanism that can be mounted on an apparatus for performing an optical magnetic resonance method and can remove deposits on a sensor surface is mounted, and removal of contamination of the sensor surface can be determined. In a component analysis apparatus according to the present invention, a sensor includes therein a defect having an electron spin that causes electron spin resonance, an orientation of the electron spin can be optically detected, and an ozone generation device and an oxygen radical generation device are driven during washing of the sensor.

9 Claims, 12 Drawing Sheets

FIG. 11

| CONDITIONS | WAVELENGTH OF EMITTED ULTRAVIOLET RAYS (nm) | INTENSITY OF EMITTED ULTRAVIOLET RAYS (mW/cm²) | DISTANCE BETWEEN ULTRAVIOLET LIGHT SOURCE AND SURFACE OF DIAMOND (cm) | ELEMENT ACTING ON DIAMOND |
|---|---|---|---|---|
| 1101 | ABOUT 254 | 1.2 | 1.2 | ULTRAVIOLET RAYS |
| 1102 | ABOUT 254 | 9.8 | 1.2 | ULTRAVIOLET RAYS |
| 1103 | ABOUT 185 AND ABOUT 254 | 6.6 | 0.5 | OXYGEN RADICALS |
| 1104 | ABOUT 185 AND ABOUT 254 | 4.8 | 1.2 | OXYGEN RADICALS |
| 1105 | NO ULTRAVIOLET RAYS IRRADIATION | NO ULTRAVIOLET RAYS IRRADIATION | NO ULTRAVIOLET RAYS IRRADIATION | OZONE |

COMPONENT ANALYSIS APPARATUS AND COMPONENT ANALYSIS METHOD

BACKGROUND OF THE INVENTION

1. Field of the Invention

The present invention relates to a technique for analyzing a component of a sample using an optical nuclear magnetic resonance method.

2. Description of Related Art

In recent years, an optical nuclear magnetic resonance technique using diamond has been proposed. An electron spin present on a complex defect (referred to as an NV center) of a nitrogen-vacancy existing in the diamond has a property of absorbing light having a wavelength of 532 nm and emitting red fluorescence. When the electron spin emits a microwave of about 2.87 GHz in a case where there is no applied static magnetic field from an outside, the electron spin absorbs the microwave and turns into an excited state. Accordingly, an intensity of red fluorescence when the light having a wavelength of about 532 nm is emitted decreases. This phenomenon is called an electron spin resonance phenomenon. On the other hand, in a case where there is an applied static magnetic field from the outside, since a wavelength of the microwave to be absorbed is proportional to a value of the applied static magnetic field, the wavelength of the microwave at which the electron spin resonance phenomenon occurs changes from about 2.87 GHz. Therefore, by measuring dependence of the intensity of the red fluorescence when the light of about 532 nm is emitted with respect to a wavelength of the microwave to be emitted, an intensity of a magnetic field felt by the NV center of the diamond can be quantified. Further, by pulse-emitting the microwave and the emitted light of about 532 nm instead of continuous emitting in terms of time, the intensity of the magnetic field can be detected with high sensitivity. When the pulse-emitting method is used, not only a static magnetic field but also an AC magnetic field having a specific frequency can be detected.

When a molecule containing hydrogen, fluorine, or the like is present in a vicinity of the NV center of the diamond, an AC nuclear magnetic field formed by a nucleus of hydrogen, fluorine, or the like can be detected. A method for detecting the nuclear magnetic field is called a nuclear magnetic resonance method. In order to distinguish a nuclear magnetic resonance method used in the present specification from a normal nuclear magnetic resonance method, the method in the present specification is referred to as an optical nuclear magnetic resonance method. The optical nuclear magnetic resonance method can calculate a frequency of a nuclear magnetic field by converting a detected temporal change of the AC nuclear magnetic field to the frequency. Based on the frequency, a molecular structure of the molecule containing hydrogen, fluorine, or the like can be determined. In addition, abundance of molecules can be quantified based on a magnitude of the detected nuclear magnetic field. It is known that the optical nuclear magnetic resonance method has better detection sensitivity than the normal nuclear magnetic resonance method.

PTL 1 discloses that a nanopillar formed of diamond including an NV center is placed at a tip of a probe microscope, and a sample to be measured is scanned with the nanopillar to acquire a two-dimensional image of an intensity of a magnetic field. PTL 1 further describes a method for removing foreign matter adhering to the nanopillar.

CITATION LIST

Patent Literature

PTL 1: US2015/0253355

SUMMARY OF THE INVENTION

PTL 1 describes a cleaning method in which when foreign matter adheres to a nanopillar which is a detector, the nanopillar is used to scan a separately prepared diamond to physically remove the foreign matter. However, PTL 1 does not report removing a very small amount (for example, about a molecular layer) of deposits on a surface of the diamond, and confirming whether the deposits are removed.

When the optical nuclear magnetic resonance method is used, it is necessary to place a measurement sample in the vicinity of the NV center in the diamond. This is because, in the optical nuclear magnetic resonance method, the detection sensitivity is improved as a distance between hydrogen, fluorine, or the like to be measured in the measurement sample and the NV center in the diamond is closer. Therefore, it is necessary to bring the measurement sample into close contact with the surface of the diamond.

However, when the diamond is placed in a vacuum or is placed in an environment other than an inert gas, moisture or organic matter in the environment adheres to the surface of the diamond. If there are surface deposits, even if the measurement sample is brought close to the surface of the diamond, a gap corresponding to a thickness of the surface deposits can be formed between the measurement sample and the surface of the diamond. Due to this gap, the detection sensitivity of the optical nuclear magnetic resonance method is reduced. When the surface deposits contain hydrogen, fluorine, or the like, a nuclear magnetic field signal from the surface deposits is added to measurement data of the optical nuclear magnetic resonance method in addition to a nuclear magnetic field signal from the measurement sample. The nuclear magnetic field signal from the surface deposits is an undesirable signal and is a disturbance which makes it difficult to interpret the measurement data. Therefore, it is necessary to remove the deposits on the surface of the diamond before the measurement sample is brought into close contact with the diamond.

In a related art, as a cleaning method for removing deposits on a surface of a diamond, an acid solution washing method of heating in a mixed solution of sulfuric acid and nitric acid or a mixed solution of sulfuric acid and hydrogen peroxide solution for a predetermined time is used. When the method is used, the deposits on the surface of the diamond can be removed. However, on the other hand, organic solvent washing or pure water washing for removing the acid residues remaining on the surface of the diamond, which is performed after the acid solution washing, causes organic matter and moisture to adhere again to the surface of the diamond. Therefore, when the acid solution washing method is applied, it is inevitable that the organic matter and the moisture adhere to the surface of the diamond. Therefore, even when the surface of the diamond and the measurement sample are brought into close contact, since there is the gap due to the deposits therebetween, a decrease in detection sensitivity of the optical nuclear magnetic resonance method cannot be avoided. In addition, since the acid solution washing method requires a dedicated facility for treating an acid, it is difficult to mount the facility to an optical nuclear magnetic resonance apparatus.

In other words, a cleaning method that can be applied to the optical nuclear magnetic resonance apparatus and can clean the surface of the diamond in situ and can remove the deposits on the surface of the diamond is not established. In addition, no technique for confirming whether the deposits on the surface of the diamond are reduced to such an extent that an influence on the measurement data of the optical nuclear magnetic resonance method can be ignored is established.

The present invention has been made in view of the above problems, and an object thereof is to provide an optical nuclear magnetic resonance apparatus in which a cleaning mechanism that can be mounted on an apparatus for performing an optical magnetic resonance method and can remove deposits on a sensor surface is mounted, and removal of contamination of the sensor surface can be determined.

In a component analysis apparatus according to the present invention, a sensor includes therein a defect having an electron spin that causes electron spin resonance, an orientation of the electron spin can be optically detected, and an ozone generation device and an oxygen radical generation device are driven during washing of the sensor.

According to the component analysis apparatus according to the present invention, deposits on a sensor surface can be removed on an optical magnetic resonance apparatus, and cleanliness of the sensor surface can be determined.

BRIEF DESCRIPTION OF THE DRAWINGS

FIG. 11 illustrates experimental conditions under which the surface of the diamond is cleaned using oxygen radicals.

DESCRIPTION OF EMBODIMENTS

Hereinafter, embodiments of the present invention will be described with reference to the drawings. In the present embodiment, a step of removing deposits on a surface of a diamond by using an oxygen radical generation device in presence of oxygen, a step of determining cleanliness of the surface of the diamond by optical nuclear magnetic resonance measurement, and a step of bringing a measurement sample into close contact with the diamond to perform optical nuclear magnetic resonance measurement on the measurement sample are provided.

As the oxygen radical generation device used in the present embodiment, an ultraviolet light source emitting a wavelength of about 185 nm and a wavelength of about 254 nm is described as an example, and a combination of an ultraviolet light source or a light emitting diode (LED) emitting a wavelength of 254 nm and a discharge tube generating ozone may be used. The ultraviolet light source or the LED may be provided inside an optical nuclear magnetic resonance measurement chamber, or light may be guided from an ultraviolet light source or an LED provided outside the chamber to the optical nuclear magnetic resonance measurement chamber. In addition, the ultraviolet light source or the LED may be provided in a cleaning chamber provided in a vicinity of the optical nuclear magnetic resonance measurement chamber.

Figure 1:
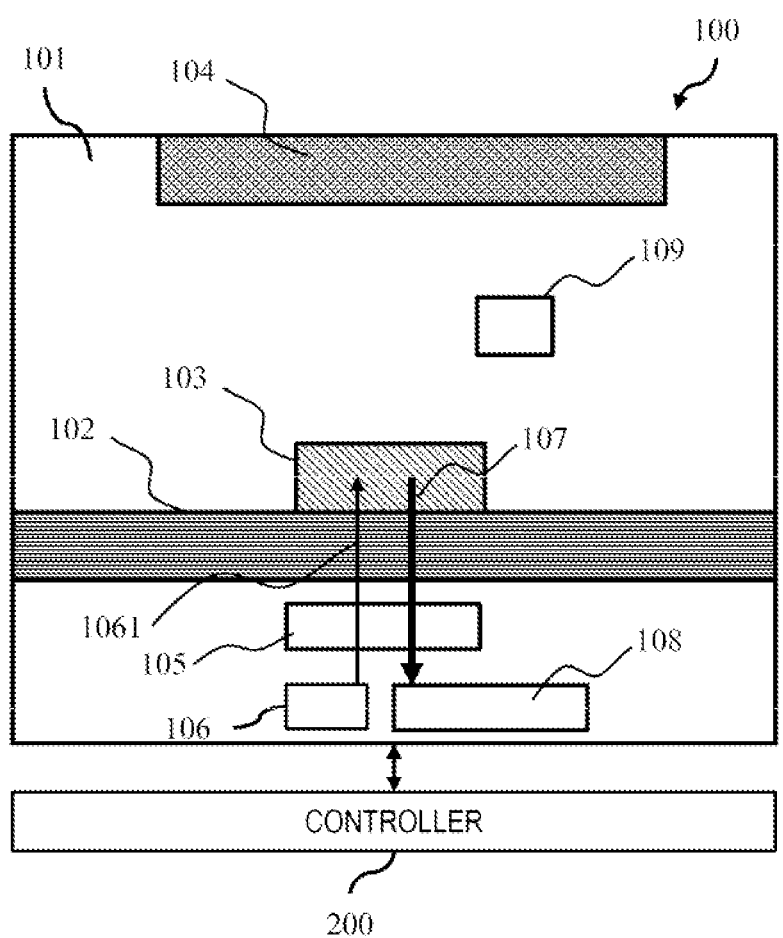
FIG. 1 is a schematic side view illustrating a configuration of a component analysis apparatus 100.

FIG. 1 is a schematic side view illustrating a configuration of a component analysis apparatus 100 according to the present embodiment. Inside an optical nuclear magnetic resonance measurement chamber 101, a diamond 103 (nuclear magnetic field sensor) is provided on a microwave emitting device 102. An ultraviolet light source 104 for emitting ultraviolet rays is provided above the microwave emitting device 102 and the diamond 103. A lens 105 is disposed below the diamond 103. A laser light source 106 irradiates the diamond 103 with a laser 1061 having a wavelength of 532 nm via the lens 105. Red fluorescence 107 emitted from the diamond 103 by laser irradiation is detected by a detector 108 via the lens 105. The detector 108 measures an orientation of an electron spin inside the diamond 103 by measuring an intensity of the fluorescence. A magnet 109 that applies a static magnetic field to the diamond 103 is provided in a vicinity of the diamond 103. A controller 200 controls components in the component analysis apparatus 100.

In the present invention, oxygen radicals are used for cleaning a surface of the diamond 103. Therefore, when ultraviolet rays are emitted from the ultraviolet light source 104, it is necessary that oxygen molecules exist inside the optical nuclear magnetic resonance measurement chamber 101. Therefore, the inside of the optical nuclear magnetic resonance measurement chamber 101 may be in the same atmosphere as air atmosphere, or may be provided with an exhaust mechanism and a mechanism for introducing a gas containing oxygen.

The ultraviolet light source 104 may be configured such that wavelengths of the ultraviolet rays emitted from the ultraviolet light source 104 include or can be switchable between about 185 nm and about 254 nm. The ultraviolet rays of 185 nm react with oxygen to generate ozone, and ozone react with the ultraviolet rays of 254 nm to decompose ozone to generate oxygen radicals, thereby washing the diamond 103. When ozone and oxygen radicals are generated using a light source that emits two types of ultraviolet rays in this way, it can be considered that an ozone generation device and the oxygen radical generation device are substantially integrated.

Figure 2:
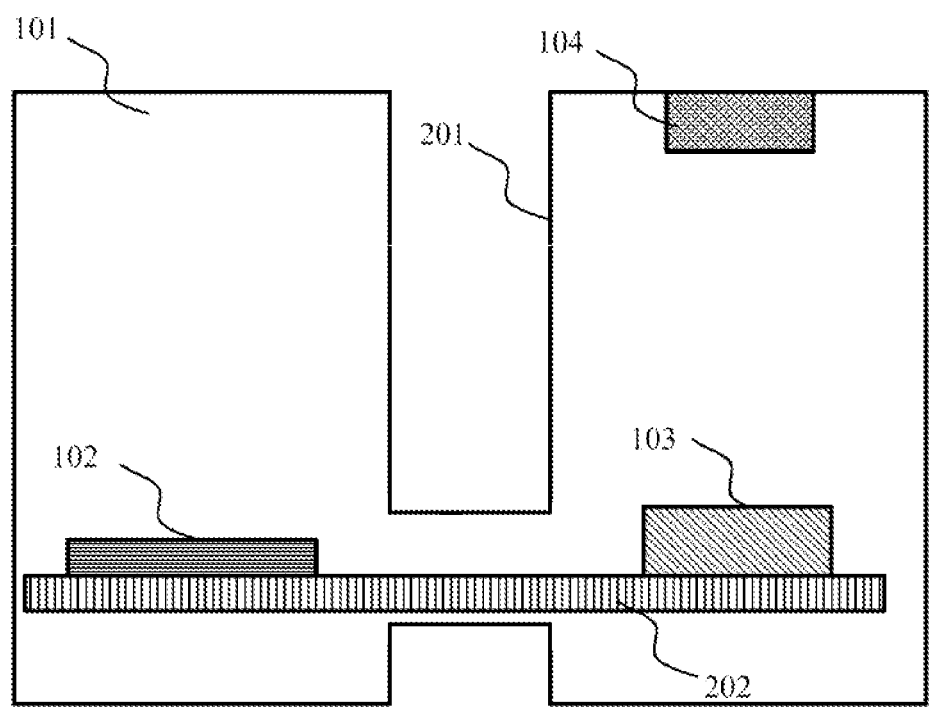
FIG. 2 is a schematic side view illustrating another configuration example of an optical nuclear magnetic resonance measurement chamber 101.

FIG. 2 is a schematic side view illustrating another configuration example of the optical nuclear magnetic resonance measurement chamber 101. In FIG. 1, the ultraviolet light source 104 for cleaning the surface of the diamond 103 is accommodated inside the optical nuclear magnetic resonance measurement chamber 101, and as in FIG. 2, a cleaning chamber 201 in which the ultraviolet light source 104 is provided may be provided separately from the optical nuclear magnetic resonance measurement chamber 101. The diamond 103 is cleaned inside the cleaning chamber 201, thereafter, the diamond 103 is moved to the optical nuclear magnetic resonance measurement chamber 101 by using a movable mechanism 202, and the diamond 103 is placed on the microwave emitting device 102 inside the optical nuclear magnetic resonance measurement chamber 101. In FIG. 2, the optical nuclear magnetic resonance measurement chamber 101 and the cleaning chamber 201 may be spatially connected or may not be connected. That is, it is sufficient that the diamond 103 can be moved between the chambers.

Figure 3:
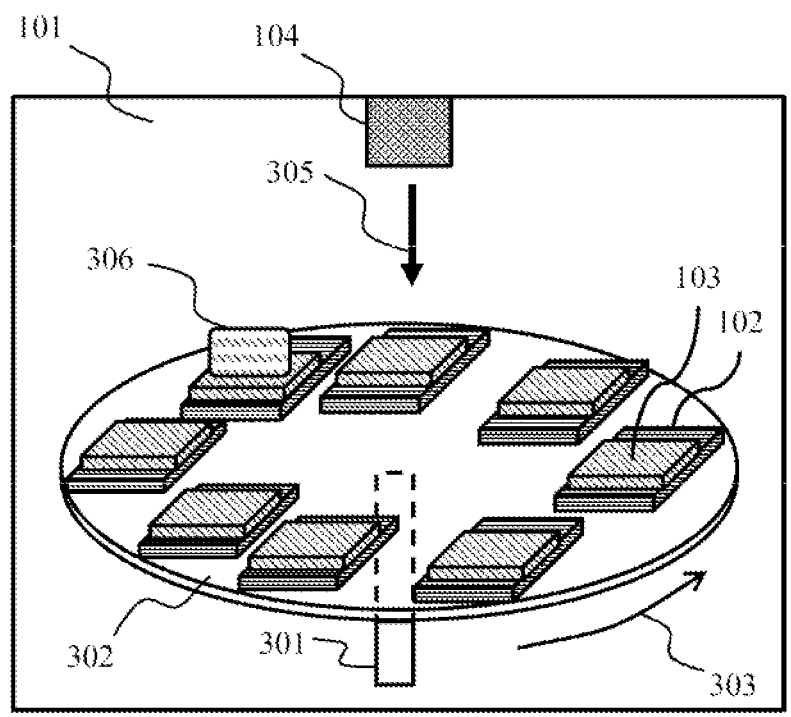
FIG. 3 is a perspective view illustrating another configuration example of a microwave emitting device 102.

FIG. 3 is a perspective view illustrating another configuration example of the microwave emitting device 102. A position of the microwave emitting device 102 does not necessarily have to be fixed, and may be movable. For example, as illustrated in FIG. 3, a plurality of microwave emitting devices 102 are provided on a movable support member 302 (rotary plate) that rotates about a rotary shaft 301 as a central shaft, the diamonds 103 are provided on the respective microwave emitting devices 102, and the movable support member 302 is rotated in a direction of an orientation 303. The ultraviolet light source 104 is provided on the movable support member 302, and the diamond 103 moved immediately below the ultraviolet light source 104 is irradiated with ultraviolet rays 305, thereby generating ozone (and oxygen radicals, the same applies hereinafter) to clean the surface of the diamond 103. In addition, when the movable support member 302 rotates, the diamond 103 cleaned by the ultraviolet rays also rotates to leave an ultraviolet irradiation region and move to a measurement position. A measurement sample 306 is placed on the diamond 103 moved to the measurement position, and optical nuclear magnetic resonance measurement is performed. By repeating the above, the optical nuclear magnetic resonance measurement can be performed temporally continuously. The movable support member 302 (and 401 described later) can be controlled by the controller 200.

Figure 4:
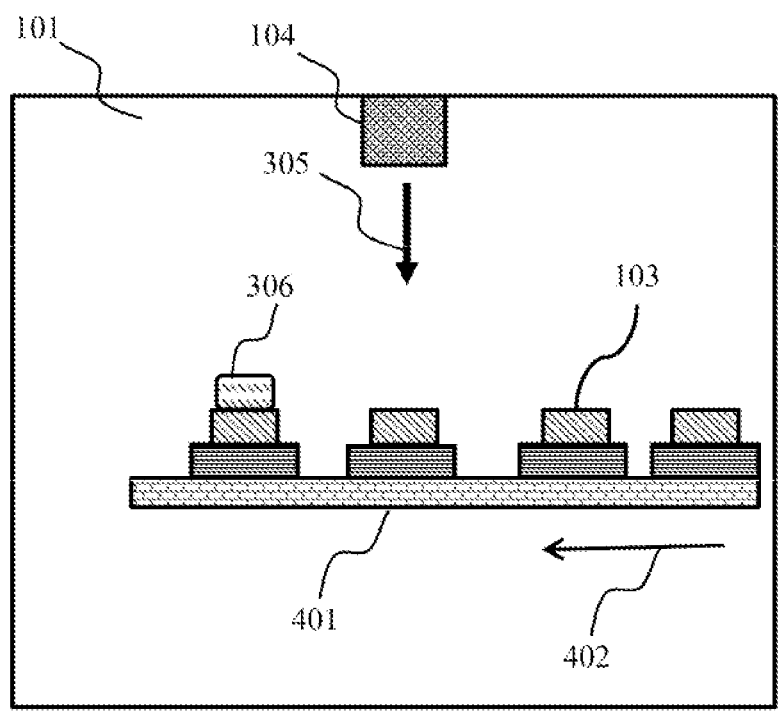
FIG. 4 is a schematic side view illustrating another configuration example of the microwave emitting device 102.

FIG. 4 is a schematic side view illustrating another configuration example of the microwave emitting device 102. As illustrated in FIG. 4, the microwave emitting device 102 may be provided on a belt-shaped movable support member 401. A plurality of microwave emitting devices 102 are provided on the movable support member 401, and the diamond 103 is placed on the microwave emitting device 102. When the movable support member 401 moves in a linear direction 402 and reaches directly below the ultraviolet light source 104, the ultraviolet light source 104 irradiates the surface of the diamond 103 with the ultraviolet rays 305. Accordingly, ozone is generated and the surface of the diamond 103 is cleaned. The movable support member 401 further moves, and the cleaned diamond 103 leaves the ultraviolet irradiation region of the ultraviolet light source 104 and moves to the measurement position. The measurement sample 306 is placed on the diamond 103 moved to the measurement position, and the optical nuclear magnetic resonance measurement is performed. By repeating the above, the optical nuclear magnetic resonance measurement can be performed temporally continuously.

Figure 5:
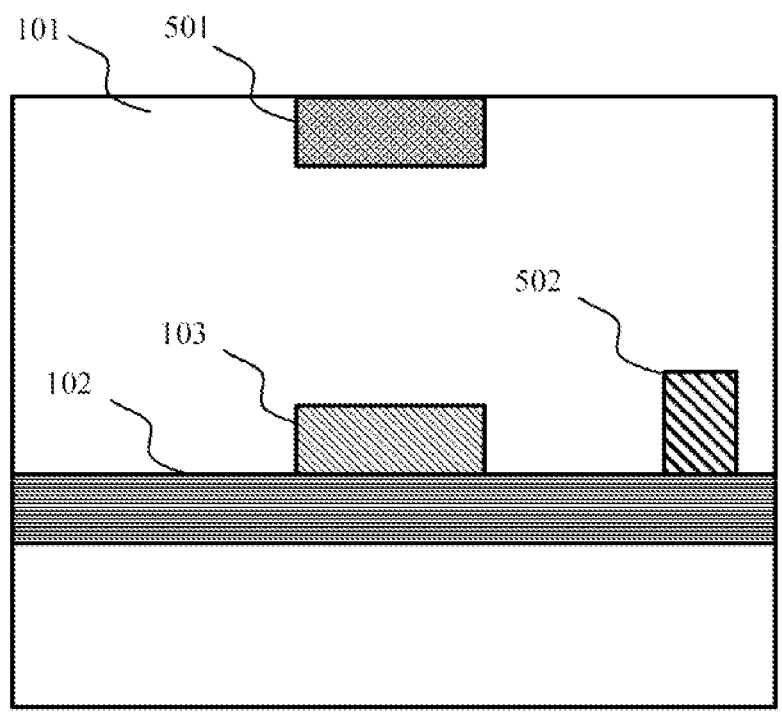
FIG. 5 is a schematic side view illustrating another configuration example of an oxygen radical generation device.

FIG. 5 is a schematic side view illustrating another configuration example of the oxygen radical generation device. In place of the ultraviolet light source 104, for example, a combination of an LED or an ultraviolet light source 501 that emits ultraviolet rays having a wavelength of about 254 nm and a discharge tube 502 for generating ozone, as illustrated in FIG. 5, can also be used. The discharge tube 502 may be provided outside the optical nuclear magnetic resonance measurement chamber 101 and configured to introduce ozone into the optical nuclear magnetic resonance measurement chamber 101 through a pipe.

Figure 6:
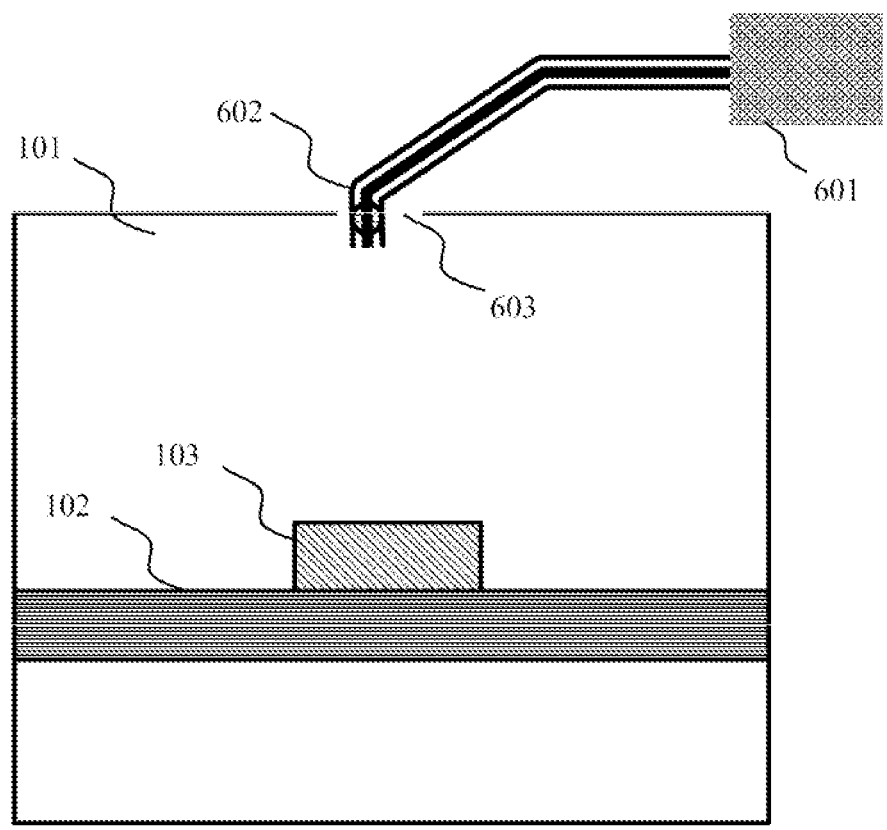
FIG. 6 is a schematic side view illustrating another configuration example of the oxygen radical generation device.

FIG. 6 is a schematic side view illustrating another configuration example of the oxygen radical generation device. As illustrated in FIG. 6, the ultraviolet rays may be guided by using a fiber 602 (optical path) from an ultraviolet power source 601 that emits ultraviolet rays having wavelengths of about 185 nm and about 254 nm, and the diamond 103 may be irradiated with the ultraviolet rays through a hole 603 formed in an upper portion of the optical nuclear magnetic resonance measurement chamber 101.

A nuclear magnetic resonance method is often performed in a chamber covered with a magnetic shield. Since the magnetic shield is generally formed of expensive metal, it is difficult to increase a size of the apparatus as a whole. As a result, the chamber also tends to be reduced in size, and a space for the ultraviolet light source in the chamber may not be provided. The configuration of FIG. 6 has an advantage that the ozone generation device can be constructed even in such a case.

Figure 7:
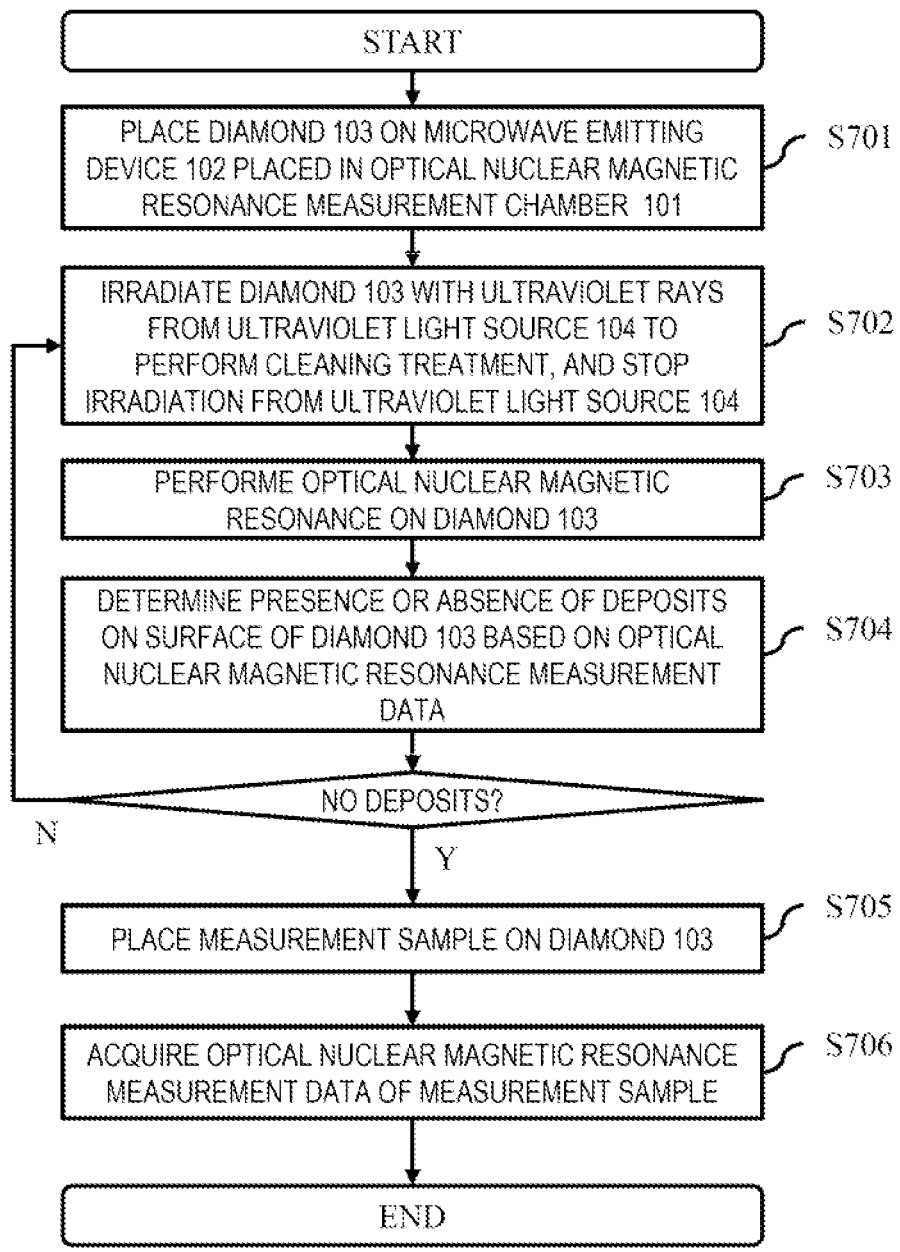
FIG. 7 is a flowchart illustrating a procedure for the component analysis apparatus 100 to measure a component of a sample using optical nuclear magnetic resonance.

FIG. 7 is a flowchart illustrating a procedure for the component analysis apparatus 100 to measure a component of a sample using the optical nuclear magnetic resonance. Each step of the flowchart is performed by the controller 200 controlling each component of the component analysis apparatus 100. Hereinafter, each step of FIG. 7 will be described.

In S701, the diamond 103 is placed on the microwave emitting device 102 provided in the optical nuclear magnetic resonance measurement chamber 101.

In S702, the diamond 103 is irradiated with the ultraviolet rays having wavelengths of about 185 nm and about 254 nm from the ultraviolet light source 104, and the diamond 103 is subjected to the cleaning treatment. After the cleaning treatment, the emission from the ultraviolet light source 104 is stopped.

In S703, the optical nuclear magnetic resonance measurement is performed on the cleaned diamond 103, and a measurement result is recorded as measurement data. The optical nuclear magnetic resonance measurement is a method for analyzing a component of a sample using electron spin resonance in an NV center present inside the diamond 103, and details will not be described here since specific contents are described in the background.

In S704, based on the optical nuclear magnetic resonance measurement data obtained in S703, it is determined whether deposits such as organic matter or moisture remain on the surface of the diamond 103. That is, it is determined whether the washing of the diamond 103 is completed (or whether the diamond 103 needs to be re-washed). When it is confirmed that the deposits are present on the diamond 103, the process returns to S702, and the cleaning treatment using the ultraviolet light source 104 is performed again. When it is confirmed that the deposits are not present on the diamond 103, it is determined that the deposits on the surface of the diamond 103 are removed to an amount that does not affect the optical nuclear magnetic resonance measurement data, and the process proceeds to S705.

In S705, the measurement sample is brought into close contact with an upper portion of the diamond 103.

In S706, the optical nuclear magnetic resonance measurement is performed to acquire the optical nuclear magnetic resonance measurement data of the measurement sample. In the step, the ozone generation device and the oxygen radical generation device may be driven or may not be driven.

Figure 8:
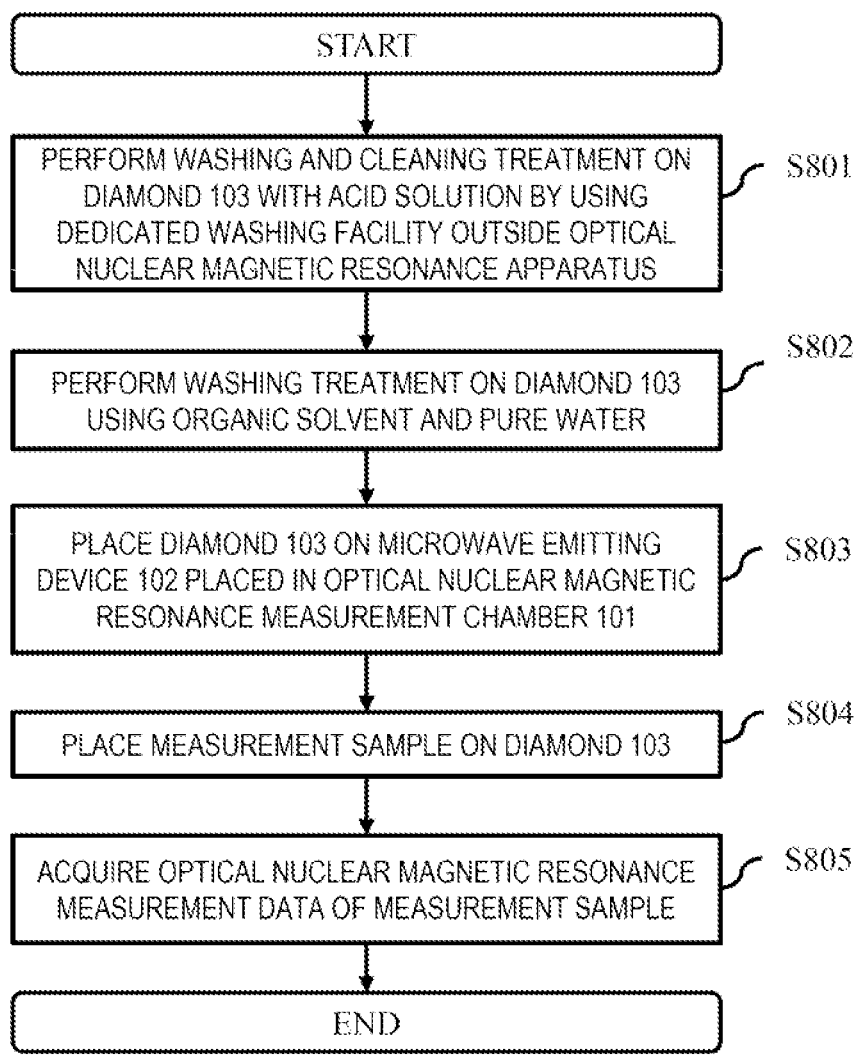
FIG. 8 is a flowchart illustrating a measurement procedure of optical nuclear magnetic resonance generally used for cleaning a surface of a diamond.

FIG. 8 is a flowchart illustrating a measurement procedure of optical nuclear magnetic resonance generally used for cleaning a surface of a diamond. For comparison with the measurement procedure in the present invention, a general procedure illustrated in FIG. 8 will be described.

In S801, the diamond 103 is subjected to the washing treatment with an acid solution (for example, a mixed solution of sulfuric acid and nitric acid) by using a dedicated washing facility such as an organic draft outside an optical nuclear magnetic resonance apparatus. In S802, residues of the acid solution remaining on the surface of the diamond 103 after S801 are washed by ultrasonic washing using an organic solvent such as acetone, and further washed using pure water. In step S803, the diamond 103 is placed on the microwave emitting device 102 provided in the optical nuclear magnetic resonance measurement chamber 101. In S804, the measurement sample is brought into close contact with the upper portion of the diamond 103. In step S805, the optical nuclear magnetic resonance measurement data of the measurement sample is acquired.

In the measurement procedure of FIG. 8, an organic solvent such as acetone and pure water used in S802 adhere to the surface of the diamond 103. This results in noise with respect to the measurement result, and measurement accuracy is reduced.

Figure 9:
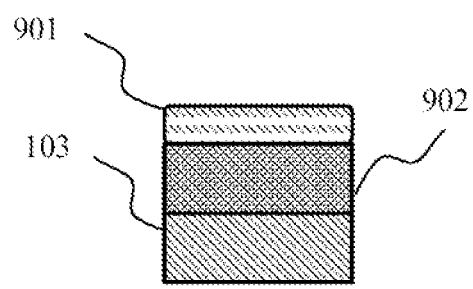
FIG. 9 is a schematic side view illustrating a state in which foreign matter adheres in a measurement procedure in a related art.

FIG. 9 is a schematic side view illustrating a state in which foreign matter adheres in a measurement procedure in the related art. As illustrated in FIG. 9, when a measurement sample 901 is placed on the diamond 103 in S804, since deposits 902 exist between the diamond 103 and the measurement sample 901, a gap is generated between the diamond 103 and the measurement sample 901, and detection sensitivity of the optical nuclear magnetic resonance is reduced. In addition, since a signal from hydrogen atoms contained in the deposits 902 is mixed with a signal from the measurement sample 901, it becomes a disturbance of a signal of the optical nuclear magnetic resonance.

Figure 10:
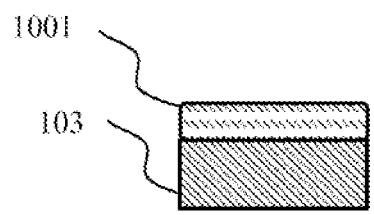
FIG. 10 is a schematic side view illustrating a state in which a measurement sample 1001 is placed on a diamond 103 in a measurement procedure according to an embodiment.

FIG. 10 is a schematic side view illustrating a state in which a measurement sample 1001 is placed on the diamond 103 in the measurement procedure according to the present embodiment. In a measurement protocol of the optical nuclear magnetic resonance of FIG. 7, the surface of the diamond 103 can be cleaned without using the solution, the cleanliness can be determined from the optical nuclear magnetic resonance, and if the deposits remain, the cleaning treatment of S702 can be performed until the deposits are completely cleaned. Therefore, when the measurement sample is placed on the diamond 103 in S706, no deposit is present on the surface of the diamond 103 as illustrated in FIG. 10, so that the measurement sample 1001 and the diamond 103 can be brought into close contact.

First Embodiment: Summary

The component analysis apparatus 100 according to the first embodiment removes the deposits on the diamond 103 with oxygen radicals, and then determines the cleanliness of the surface of the diamond 103 by the optical nuclear magnetic resonance measurement. After it is confirmed that an influence of the deposits does not affect the optical nuclear magnetic resonance measurement data, that is, the deposits on the surface of the diamond are reliably removed, the measurement sample is brought into close contact with the diamond 103. Accordingly, the gap between the diamond 103 and the measurement sample can be reduced, and the diamond 103 and the measurement sample can be reliably brought into close contact. Accordingly, the detection sensitivity of the optical nuclear magnetic resonance measurement can be improved, and the disturbance of the optical nuclear magnetic resonance measurement data caused by the deposits can be reduced.

Second Embodiment

In a second embodiment of the present invention, another configuration example of the components in the component analysis apparatus 100 will be described. Since the other components are the same as those in the first embodiment, the description thereof is omitted in the second embodiment.

The microwave emitting device 102 may include a printed circuit board, or may be a small microwave emitter formed of wires. The microwave emitting device 102 does not necessarily need to be present below the diamond 103, and may be provided as long as microwaves can be emitted to the diamond 103.

The ultraviolet light source 104 does not necessarily need to be disposed above the diamond 103, and may be provided as long as the emitted ultraviolet rays are preferably emitted to the diamond 103.

The lens 105 is not necessarily below the diamond 103, and may be disposed as long as the diamond 103 can be irradiated with the laser 1061 and the red fluorescence 107 can be condensed. Any optical element may be present between the lens 105 and the detector 108, and the lens 105 and the detector 108 may be present outside the optical nuclear magnetic resonance measurement chamber 101.

The magnet 109 may be a permanent magnet or an electromagnet. The wavelength of the laser 1061 is not necessarily limited to 532 nm, and may be any wavelength at which a sensor material emits fluorescence.

Third Embodiment

In a third embodiment of the present invention, a cleaning effect on a surface of a diamond using oxygen radicals will be specifically described. Since the configuration of the component analysis apparatus 100 is the same as that in the first and second embodiments, the description thereof is omitted in the third embodiment.

FIG. 11 illustrates experimental conditions under which the surface of the diamond is cleaned using oxygen radicals. An intensity of ultraviolet rays is 1.2 mW/cm$^2$ to 9.6 mW/cm$^2$, a distance between an ultraviolet light source emitting the ultraviolet rays and the surface of the diamond is 0.5 cm and 1.2 cm, and these values may be set freely. Since a time required for cleaning is preferably within one hour, the intensity of the ultraviolet rays is preferably 4.8 mW/cm$^2$ or more, and the distance between the ultraviolet light source and the diamond is preferably 1.2 cm or less. When the intensity of the ultraviolet rays is stronger, the distance between the ultraviolet light source and the diamond may be longer than 1.2 cm.

Figure 12:
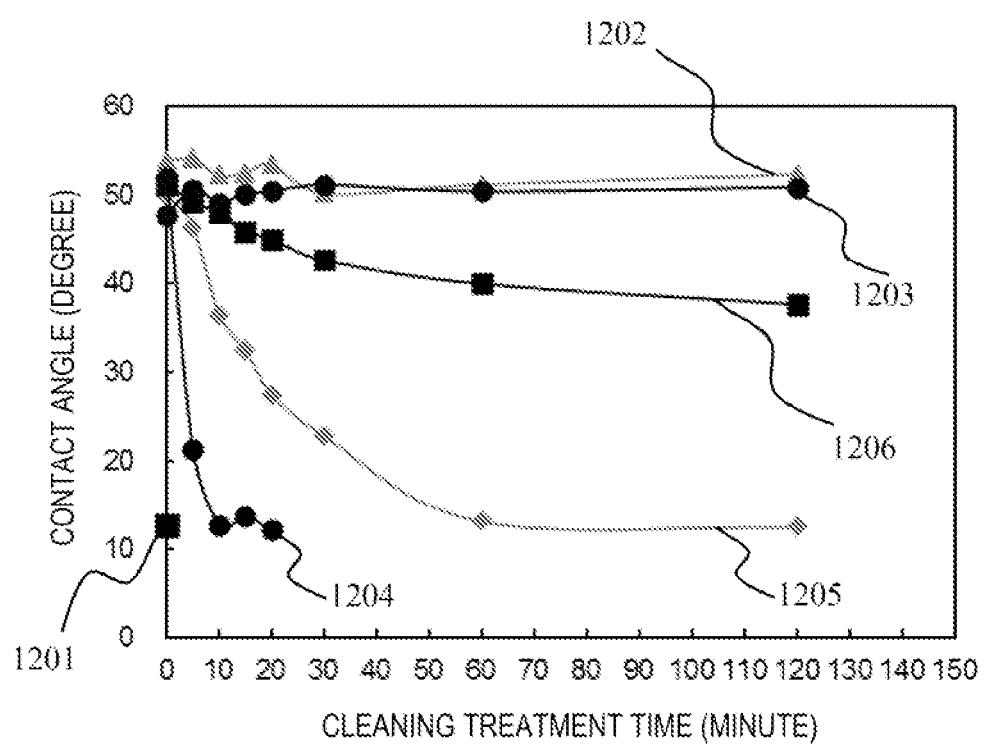
FIG. 12 illustrates results of a contact angle experiment using pure water as a probe performed on a surface of a diamond subjected to a cleaning treatment under the experimental conditions illustrated in FIG. 11, with a horizontal axis representing a cleaning treatment time and a vertical axis representing a contact angle.

FIG. 12 illustrates results of a contact angle experiment using pure water as a probe performed on the surface of the diamond subjected to the cleaning treatment under the experimental conditions illustrated in FIG. 11, with a horizontal axis representing a cleaning treatment time and a vertical axis representing a contact angle. From a value of the contact angle measured on the surface of the diamond immediately after the cleaning treatment is performed using an acid solution, that is, a value 1201 of the contact angle on the cleaned surface of the diamond, it can be seen that the contact angle of the cleaned surface of diamond is about 12 degrees. Since the value also depends on unevenness of the surface of the diamond, the value does not necessarily become 12 degrees.

After the diamond is left in the atmosphere for one week, the contact angle of the surface of the diamond is as large as about 50 degrees. The change is caused by a fact that organic matter in the atmosphere adheres to the surface of the diamond. Since the value depends on an environment to be left, the value does not necessarily become about 50 degrees.

Under conditions 1101 and 1102, a cleaning treatment is performed by emitting only ultraviolet rays to the diamond in which deposits are present on the surface (that is, without generating oxygen radicals). Values 1202 and 1203 of the contact angle correspond to these conditions. Since the contact angle at this time is substantially constant without depending on the intensity of the ultraviolet rays, it can be seen that the deposits on the surface of the diamond cannot be removed by the irradiation with only the ultraviolet rays, and are not cleaned.

Under condition 1105, only ozone is exposed to the diamond in which the deposits are present on the surface. A value 1206 of the contact angle corresponds to the condition. The contact angle at this time showed a tendency to gradually decrease. However, when calculating, based on this change in reduction rate, a time required until the surface of the diamond is completely cleaned, that is, a time required for the contact angle to decrease to about 12, it lasts for several months or more and is not suitable for the cleaning treatment.

Under condition 1104, irradiation is performed with ultraviolet rays having wavelengths of about 185 nm and about 254 nm (that is, treatment using oxygen radicals). A value 1205 of the contact angle corresponds to the condition. When a distance between an ultraviolet lamp and the surface of the diamond is 1.2 cm, a measurement value of the contact angle is about 12 degrees at about 60 minutes, and is substantially equal to a value of the cleaned surface. That is, it can be seen that in the case of the cleaning treatment using oxygen radicals, the deposits on the surface of the diamond can be removed in a short time.

Under condition 1103, the distance between the ultraviolet lamp and the surface of the diamond is further shortened to 0.5 cm. A value 1204 of the contact angle corresponds to the condition. At this time, the measurement value of the contact angle is about 12 degrees at about 15 minutes. Therefore, it can be seen that the shorter the distance between the ultraviolet lamp and the diamond, the more the surface of the diamond can be cleaned in a shorter time.

Figure 13:
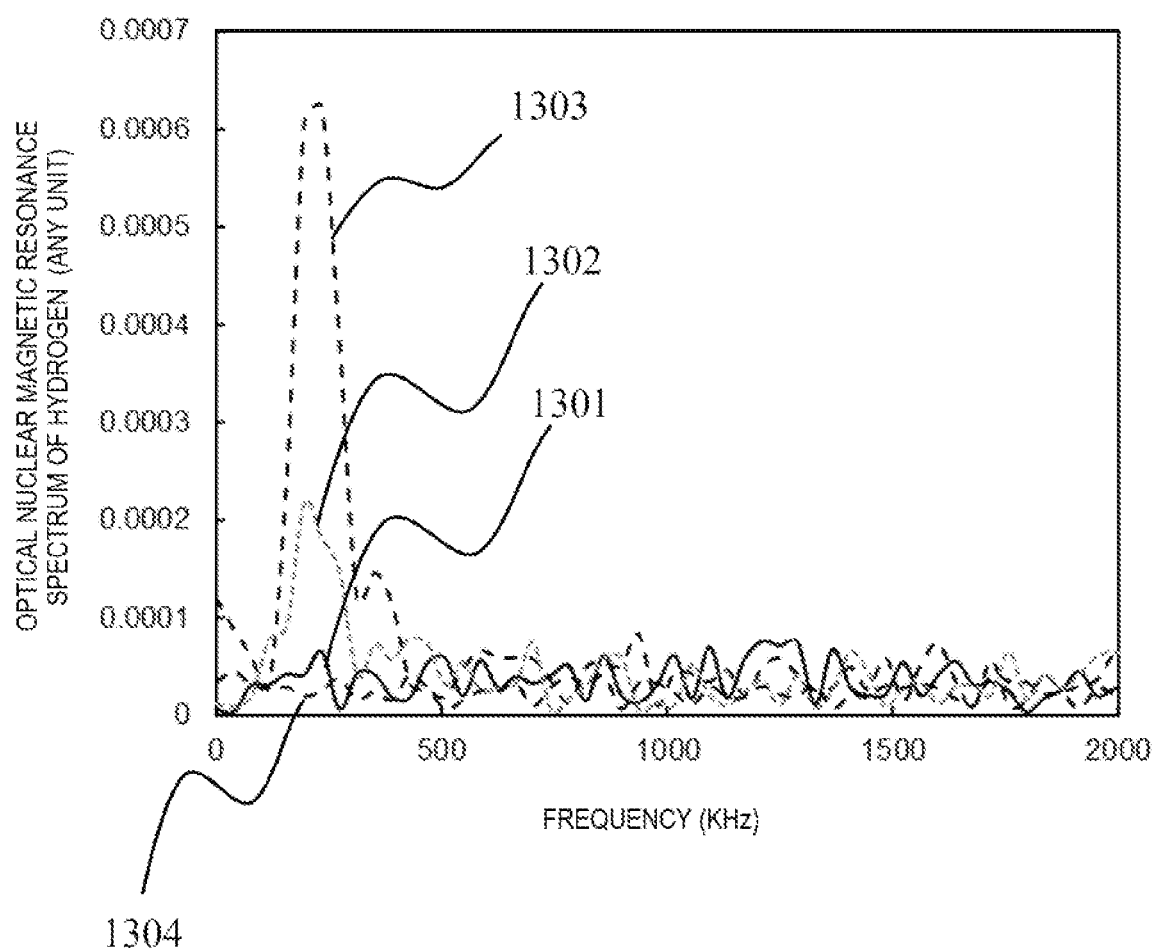
FIG. 13 illustrates results obtained by quantifying amounts of organic matter and moisture adhering to the surface of the diamond from optical nuclear magnetic resonance measurement when a cleaning treatment using oxygen radicals is performed and the diamond from which deposits on the surface are removed is placed in atmosphere.

FIG. 13 illustrates results obtained by quantifying amounts of organic matter and moisture adhering to the surface of the diamond from optical nuclear magnetic resonance measurement when the cleaning treatment using oxygen radicals is performed and the diamond from which the deposits on the surface are removed is left in atmosphere. The optical nuclear magnetic resonance measurement detects the organic matter and hydrogen atoms contained in water. In an optical nuclear magnetic resonance measurement spectrum of FIG. 13, a horizontal axis represents a frequency of a nuclear magnetic field formed by nuclear spins of the hydrogen atoms, and a vertical axis represents abundance of the hydrogen atoms. This optical nuclear magnetic resonance spectrum is measured after the diamond is cleaned and left in the air for 0 hours, 12 hours, and 120 hours, then placed in an optical nuclear magnetic resonance apparatus chamber without a cleaning treatment.

Although a spectrum 1301 is a result of leaving for 0 hours, since a signal is not visible, it can be seen that the amount of the deposits on the surface of the diamond is equal to or less than a detection limit of the optical nuclear magnetic resonance measurement. A spectrum 1302 is a result of leaving for 12 hours, and has a peak in a vicinity of 200 kHz. Since the peak is caused by the hydrogen atoms contained in the deposits on the surface of the diamond, it can be seen that the organic matter and moisture present in the atmosphere adhere to the surface of the diamond by leaving the surface of the diamond in the atmosphere for 12 hours. A spectrum 1303 is obtained by measuring after being left for 120 hours, and a peak exists at a position of 200 kHz that is the same as the spectrum 1302, and the peak increases. Therefore, the peak of the spectrum 1303 is caused by the same reason as that of the spectrum 1302, that is, is caused by the organic matter and hydrogen contained in the deposits on the surface of the diamond, and an adhesion amount increases with a leaving time. A spectrum 1304 is an optical nuclear magnetic resonance measurement result measured after the cleaning treatment using oxygen radicals of the present invention is performed on the diamond providing the spectrum 1303. Since there is no peak in the spectrum 1304, it can be seen that the deposits on the surface of the diamond are removed by the cleaning treatment.

According to the results illustrated in FIG. 13, it can be seen that, as an effect of the present invention, the deposits can be removed by performing the cleaning treatment using oxygen radicals on the diamond on which the deposits are present on the surface, and the cleanliness can be determined. Therefore, quality of the optical nuclear magnetic resonance measurement data can be improved.

<Modifications of Prevent Invention>

In the above embodiments, the ultraviolet light source 104 of FIG. 1 and the ultraviolet power source 601 of FIG. 6 have been described to have the wavelengths of the emitted ultraviolet rays of about 185 nm, about 254 nm, or about 254 nm. The wavelengths of the emitted ultraviolet rays are not limited thereto, and at least ultraviolet rays with a wavelength of about 185 nm or less which generate ozone, and ultraviolet rays with a wavelength of about 254 nm which generate oxygen radicals from the ozone, may be used.

In the above embodiments, the diamond 103 and the sample may not necessarily be in direct contact in a strict sense, and a very small amount of distance may be provided as long as the nuclear magnetic field can be detected. For example, a gap of about several nanometers may be present between the diamond 103 and the sample. Therefore, the fact that the diamond 103 and the sample are in contact with each other includes an arrangement relationship in which such a nuclear magnetic field can be detected.

In the above embodiments, the diamond is exemplified as a sensor material, and a target of the present invention is not limited thereto. That is, the present invention can also be applied in cleaning other types of sensor materials that can be used in the optical nuclear magnetic resonance method. That is, any other materials can be used in place of the diamond 103 as long as it can be used as a nuclear magnetic field sensor that detects the nuclear magnetic field of the sample while being in contact with the sample.

In the above embodiments, the controller 200 may be implemented by hardware such as a circuit device in which functions thereof are implemented, or may be implemented by executing software on which the functions thereof are implemented by an arithmetic device (for example, a central processing unit, graphics processing unit, or the like) or another computer.

What is claimed is:

1. A component analysis apparatus comprising:
   a sensor configured to detect a nuclear magnetic field of a sample while being in contact with the sample;
   an ozone generation device configured to generate ozone;
   an oxygen radical generation device configured to decompose ozone to generate oxygen radicals, wherein
      the sensor has an electron spin that causes electron spin resonance with a nuclear spin of the sample,
      an orientation of the electron spin can be optically detected,
      the ozone generation device and the oxygen radical generation device are driven during washing of the sensor;
   microwave emitting device configured to emit a microwave to the sensor;
   a magnet configured to apply a static magnetic field to the sensor;
   a laser light source configured to irradiate the sensor with laser light used to read the orientation of the electron spin;
   a lens configured to condense fluorescence emitted from the sensor when the sensor is irradiated with the laser light;
   a detector configured to measure an intensity of the fluorescence;
   a movable support member on which two or more pairs of the microwave emitting device and the sensor are placed, the two or more pairs including a first pair and a second pair; and
   a controller configured to control the movable support member, the ozone generation device, and the oxygen radical generation device, wherein
   the controller is configured to:
      wash the first pair after moving the movable support member such that the first pair is disposed at a first position at which the washing is to be performed by the oxygen radicals; and
      after the washing of the first pair is completed, move the movable support member such that the first pair is disposed at a second position at which component measurement by nuclear magnetic resonance is to be performed on the first pair, and move the movable support member such that the second pair is disposed at the first position.

2. A component analysis method for washing a sensor in a component analysis apparatus,
   the sensor having an electron spin that causes electron spin resonance with a nuclear spin of a sample, and an orientation of the electron spin being detectable optically,
   the method comprising:
      generating ozone in a chamber in which the sensor is accommodated;
      decomposing ozone to generate oxygen radicals in the chamber;
      emitting, using a microwave emitting device, a microwave to the sensor;
      applying, using a magnet, a static magnetic field to the sensor;
      irradiate, using a laser light source, the sensor with laser light used to read the orientation of the electron spin;
      condensing, using a lens, fluorescence emitted from the sensor when the sensor is irradiated with the laser light;
      measuring, using a detector, an intensity of the fluorescence;
      placing, on a movable support member, two or more pairs of the microwave emitting device and the sensor, the two or more pairs including a first pair and a second pair; and
      controlling, using a controller, that is configured to control the movable support member, the ozone generation device, and the oxygen radical generation device, wherein
   the controller is also configured to:
      wash the first pair after moving the movable support member such that the first pair is disposed at a first position at which the washing is to be performed by the oxygen radicals; and
      after the washing of the first pair is completed, move the movable support member such that the first pair is disposed at a second position at which component measurement by nuclear magnetic resonance is to be performed on the first pair, and move the movable support member such that the second pair is disposed at the first position.

3. The component analysis apparatus according to claim 1, further comprising:
   a controller configured to control the ozone generation device and the oxygen radical generation device, wherein
   the controller is configured to:
      acquire a result of performing component measurement by nuclear magnetic resonance using the electron spin resonance by the sensor in a state where the sensor and the sample are not in contact with each other; and
      determine, according to the result, whether the washing of the sensor by the oxygen radicals is completed, or whether re-washing of the sensor by the oxygen radicals is necessary.

4. The component analysis apparatus according to claim 1, further comprising:
   a measurement chamber configured to accommodate the sample when component measurement by nuclear magnetic resonance using the electron spin resonance is performed;
   a washing chamber configured to accommodate the sensor when washing the sensor; and
   a mechanism configured to move the sensor between the measurement chamber and the washing chamber, wherein
   the ozone generation device and the oxygen radical generation device are disposed in the washing chamber.

5. The component analysis apparatus according to claim 1, wherein the movable support member includes any one of a rotary plate that rotates about a rotary shaft or a belt-shaped member that moves in a linear direction.

6. The component analysis apparatus according to claim 1, wherein
the ozone generation device and the oxygen radical generation device include any one of
a light source configured to emit ultraviolet rays of two wavelengths, or
a light source configured to emit ultraviolet rays of one wavelength and a discharge tube configured to generate ozone.

7. The component analysis apparatus according to claim 1, wherein
the ozone generation device and the oxygen radical generation device include a light source configured to emit ultraviolet rays of two wavelengths,
the light source is disposed outside a chamber configured to accommodate the sensor, and
the component analysis apparatus further includes an optical path configured to guide light emitted from the light source into the chamber.

8. The component analysis apparatus according to claim 1, wherein
the sensor is made of a diamond material.

9. The component analysis apparatus according to claim 3, wherein
the controller is configured to, when component measurement by the nuclear magnetic resonance is performed after the washing of the sensor by the oxygen radicals is completed, perform the component measurement regardless of whether the oxygen radical generation device is driven.

* * * * *